United States Patent
Riva Reggiori et al.

(10) Patent No.: US 7,864,557 B2
(45) Date of Patent: *Jan. 4, 2011

(54) FLEXIBLE OTP SECTOR PROTECTION ARCHITECTURE FOR FLASH MEMORIES

(75) Inventors: Riccardo Riva Reggiori, Segrate (IT); Lorenzo Bedarida, Milan (IT); Giorgio Oddone, Genoa (IT); Fabio Tassan Caser, Arcore Milan (IT)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/529,158

(22) Filed: Sep. 28, 2006

(65) Prior Publication Data

US 2007/0025134 A1    Feb. 1, 2007

Related U.S. Application Data

(63) Continuation of application No. 11/128,648, filed on May 12, 2005, now Pat. No. 7,130,209.

(30) Foreign Application Priority Data

Oct. 15, 2004    (IT)    .............................. MI04A1967

(51) Int. Cl.
  *G11C 17/00*    (2006.01)
(52) U.S. Cl. ..................... 365/94; 365/230.03
(58) Field of Classification Search ............. 365/94, 365/230.03; 711/163
See application file for complete search history.

(56) References Cited

U.S. PATENT DOCUMENTS 5,283,759 A * 2/1994 Smith .................. 365/185.04
5,954,818 A   9/1999 Dalvi et al.
6,035,401 A   3/2000 Dalvi et al.
6,240,032 B1 * 5/2001 Fukumoto ..................... 365/222
6,266,271 B1 * 7/2001 Kawamura ............. 365/185.04

(Continued)

FOREIGN PATENT DOCUMENTS

WO    WO-2006044203 A3    4/2006

OTHER PUBLICATIONS

"International Application Serial No. PCT/US2005/035788, Search Report mailed Sep. 13, 2006", 1 pg.

*Primary Examiner*—Hoai V Ho
*Assistant Examiner*—Kretelia Graham
(74) *Attorney, Agent, or Firm*—Schwegman, Lundberg & Woessner, P.A.

(57) ABSTRACT

A method and system for protecting a memory having a plurality of blocks from modification is disclosed. The method and system include providing a plurality of one time programmable (OTP) cells and OTP cell logic coupled with the OTP cells. An OTP cell of the plurality of OTP cells corresponds to a portion of a block of the plurality of blocks. The OTP cell allows modification of the portion of the block when the OTP cell is in a first state and permanently prevents modification of the portion of the block when the OTP cell is in a second state. The OTP cell logic uses the plurality of OTP cells to select the portion of the block as corresponding to the OTP cell. This portion of the block is write protected when the OTP cell is placed in the second state.

18 Claims, 4 Drawing Sheets

U.S. PATENT DOCUMENTS

| | | | |
|---|---|---|---|
| 6,591,327 B1 * | 7/2003 | Briner et al. | 711/103 |
| 6,615,355 B2 | 9/2003 | Mattison | |
| 6,650,585 B2 | 11/2003 | Chevallier | |
| 6,662,262 B1 | 12/2003 | Kasa et al. | |
| 6,717,208 B2 | 4/2004 | Yu et al. | |
| 6,741,500 B2 * | 5/2004 | DeShazo et al. | 365/185.28 |
| 6,857,054 B2 | 2/2005 | Minne | |
| 7,130,209 B2 * | 10/2006 | Reggiori et al. | 365/94 |
| 7,239,552 B2 * | 7/2007 | Louie et al. | 365/185.22 |
| 7,433,993 B2 * | 10/2008 | Sinclair | 711/103 |
| 2001/0011318 A1 | 8/2001 | Dalvi et al. | |
| 2002/0041517 A1 | 4/2002 | Kim et al. | |
| 2002/0095545 A1 | 7/2002 | Dalvi et al. | |

\* cited by examiner

US 7,864,557 B2

FLEXIBLE OTP SECTOR PROTECTION ARCHITECTURE FOR FLASH MEMORIES

CROSS-REFERENCE TO RELATED APPLICATIONS

The present application is a continuation of U.S. patent application Ser. No. 11/128,648, entitled "FLEXIBLE OTP SECTOR PROTECTION ARCHITECTURE FOR FLASH MEMORIES" filed on May 12, 2005 7,130,209, and assigned to the assignee of the present application.

FIELD OF THE INVENTION

The present invention relates to flash memories, and more particularly to a system and method for protecting portions of a memory, such as a flash memory, in a more flexible fashion.

BACKGROUND OF THE INVENTION

Memories, such as flash memories, are used for storing a variety of data. Often, it is desirable to protect a portion of the memory from being changed. Typically, the portion of the memory is protected from being modified using conventional software protection or conventional hardware protection. If conventional software protection is used, then protect, unprotect, and lock-down commands are provided. The protect commands allows the portion of the memory to be protected from any modification. The unprotect command allows the portion of the memory to be modified. The lock-down command precludes changing the portion of the memory. If conventional hardware protection is provided, then a dedicated pad is typically provided. In most such conventional systems, when the dedicated pad is tied to ground, the portion of the memory is protected. In some conventional memories, a particular portion of the memory is pre-selected for protection.

Although the conventional software and hardware protection systems function, one of ordinary skill in the art will readily recognize that each has drawbacks. Although conventional software protection allows the protection of the portion of the memory to be dynamically changed, the protection is volatile. Consequently, once power to the memory is shut off, the protection is lost. Conventional hardware protection is nonvolatile. However, one of ordinary skill in the art will readily recognize that tying the dedicated pad to ground precludes any modification of the device. Conventional systems do exist which allow a particular block of the memory to be protected from programming in a nonvolatile fashion. However, such conventional mechanisms for providing nonvolatile protection against programming still have drawbacks such as the inability to configure the size of the portion of the memory being protected or the inability to choose the address position of the portion of the memory to be protected.

Accordingly, what is needed is an improved nonvolatile method and system for protecting memories from being modified. The present invention addresses such a need.

BRIEF SUMMARY OF THE INVENTION

The present invention provides a method and system for protecting a memory having a plurality of blocks from being modified. The method and system comprise providing a plurality of one time programmable (OTP) cells and OTP cell logic coupled with the OTP cells. An OTP cell of the plurality of OTP cells corresponds to a portion of a block of the plurality of blocks. The OTP cell allows modification of the portion of the block when the OTP cell is in a first state and permanently prevents modification of the portion of the block when the OTP cell is in a second state. The OTP cell logic uses the plurality of OTP cells to select the portion of the block as corresponding to the OTP cell. This portion of the block is write protected when the OTP cell is placed in the second state.

According to the method and system disclosed herein, the present invention allows selected portions of blocks of memory to be permanently protected from programming.

DETAILED DESCRIPTION OF THE INVENTION

The present invention relates to memory devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for protecting a memory having a plurality of blocks from being modified. The method and system comprise providing a plurality of one time programmable (OTP) cells and OTP cell logic coupled with the OTP cells. An OTP cell of the plurality of OTP cells corresponds to a portion of a block of the plurality of blocks. The OTP cell allows modification of the portion of the block when the OTP cell is in a first state and permanently prevents modification of the portion of the block when the OTP cell is in a second state. The OTP cell logic uses the plurality of OTP cells to select the portion of the block as corresponding to the OTP cell. This portion of the block is write protected when the OTP cell is placed in the second state.

The present invention will be described in terms of a particular memory having a particular number of blocks of a certain size. However, one of ordinary skill in the art will readily recognize that other memories having another number of blocks of varying sizes could be used.

Figure 1:
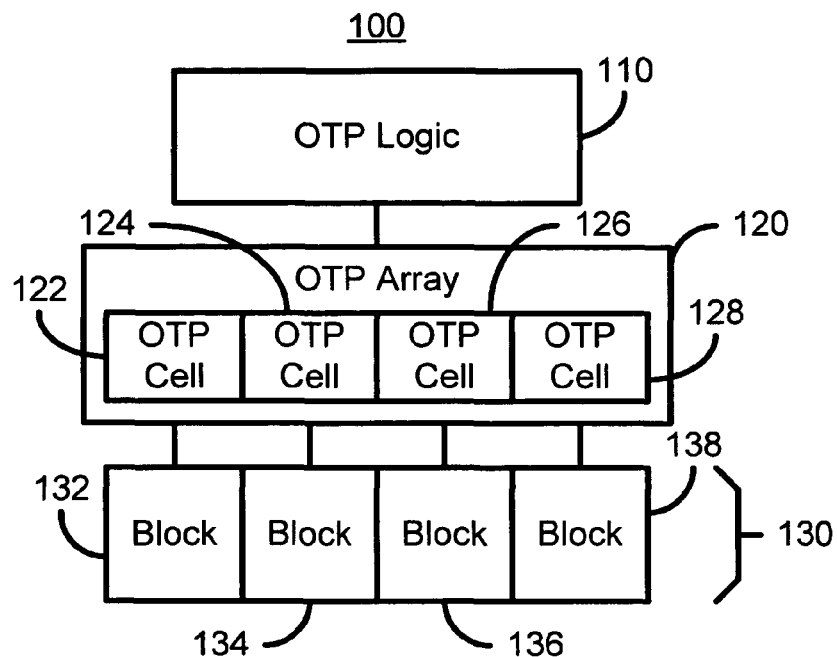
FIG. 1 is a high-level diagram of one embodiment of a system in accordance with the present invention for protecting a memory from being modified.

FIG. 1 is a high-level diagram of one embodiment of a system 100 in accordance with the present invention for protecting a memory from being programmed. The system 100 is used in protecting some portion of the memory 130 having blocks 132, 134, 136, and 138. Note that the memory 130 may merely be a portion of a larger memory. The memory 130 is simply the portion that is desired to be protected against subsequent modification. The system 100 includes OTP logic 110 and OTP array 120. The OTP array 120 includes OTP cells 122, 124, 126, and 128. Although four OTP cells 122, 124, 126, and 128 are shown, another number of OTP cells may be provided. As its name suggests, an OTP cell can be programmed only once. In general, the OTP has a first, unprogrammed state that generally corresponds to a logical one as well as a programmed state that generally corresponds to a logical zero. Once the OTP cell has been placed in the programmed state, the OTP cell cannot be erased or otherwise rewritten. The OTP cell is generally also nonvolatile, maintaining its state even when power to the system 100 is turned off.

The OTP cells 122, 124, 126, and 128 of the OTP array 120 correspond to the memory blocks 132, 134, 136, and 138 respectively. In a preferred embodiment, each OTP cell 122, 124, 126, and 128 of the OTP array is associated with a corresponding OTP latch (not explicitly shown in FIG. 1).

The OTP logic 110 determines the size of the blocks 132, 134, 136, and 138 to which OTP cells 122, 124, 126, and 128, respectively, in the OTP array 120 that are to correspond. Thus, the size of the memory 130 that can be write protected is selectable through the OTP logic 110. In a preferred embodiment, the minimum size of the blocks 132, 134, 136, and 138 is the sector size for the memory 130. Also in a preferred embodiment, the maximum size of the blocks 132, 134, 136, and 138 is the density of the memory 130 divided by the number of OTP cells 122, 124, 126, and 128. However, in an alternate embodiment, the maximum size might be different. In a preferred embodiment, the OTP logic 110 can also select certain OTP cells 122, 124, 126, and/or 128 that are actually written in order provide protection for the corresponding blocks 132, 134, 136, and/or 138. Thus, the size of the blocks 132, 134, 136, and 128 can be configured using the OTP logic 110 and the OTP cells in the sets 122, 124, and 126 of the OTP array 120.

Figure 2:
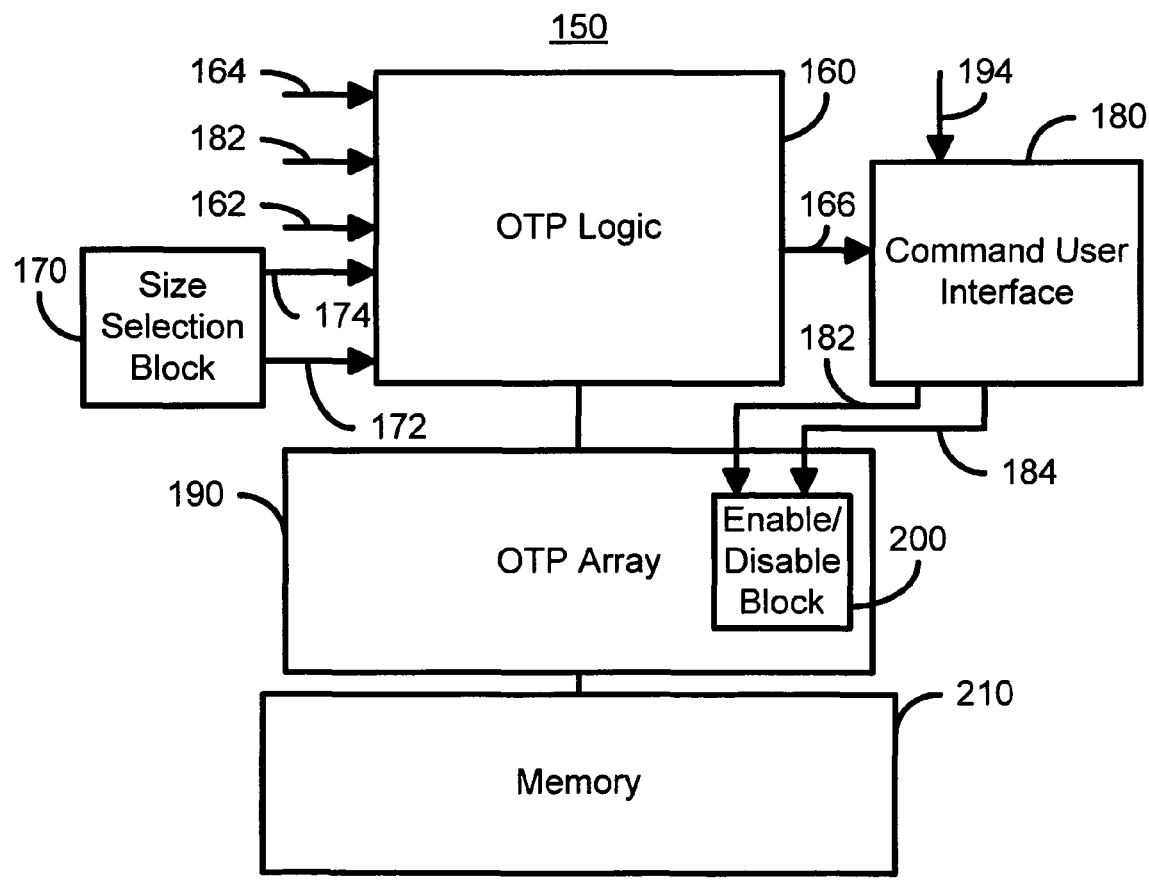
FIG. 2 is a more detailed diagram of one embodiment of a system in accordance with the present invention for protecting a memory from being modified.

FIG. 2 is a more detailed diagram of one embodiment of a system 150 in accordance with the present invention for protecting a memory from being modified. The system 150 includes OTP logic 160 and OTP array 190, which correspond to the OTP logic 110 and OTP array 120 depicted in FIG. 1. Referring back to FIG. 2, the system 150 also includes size selection block 170, command user interface (CUI) 180, and enable/disable block 200. The enable/disable block 200 is preferably implemented as part of the OTP array 190, using OTP cells (not explicitly shown in FIG. 2). However, in an alternate embodiment, the enable/disable block 200 may be separately implemented. Also depicted is memory 210.

The size selection block 170 is depicted as being implemented in hardware that allows one of two sizes to be selected. However, in another embodiment, another programmable configuration might be used. The size selection block 170 shown provides a maximum signal 172 and a minimum signal 174 indicating a maximum size and a minimum size, respectively, to be input to the OTP logic 160. Based on these signals, the OTP logic 160 sets the minimum and maximum sizes of the blocks of the memory 210. Thus, the size selection block 170 allows of each block of the memory 210 to be configured. In an alternate embodiment, other sizes, preferably between a minimum size and a maximum size, might be selected and/or another number of signals might be used.

In a preferred embodiment, the OTP logic 160 uses the maximum signal 172 and the minimum signal 174 to determine to which portions of the memory 210 a particular OTP cell corresponds. Also in such an embodiment, each OTP cell corresponds to a single block of the memory 210. For example, the memory 210 may have a density of eight megabytes and be divided into sixteen memory blocks. In such an embodiment, the OTP array 190 may include sixteen OTP cells and the sector size may be sixty-four KB. Consequently, the maximum size may be 512 KB (memory density divided by the number of OTP cells), while the minimum size may be sixty-four KB. If the maximum signal 172 and minimum signal 174 indicate that the maximum block size is to be protected, the OTP logic 160 associates each of the OTP cells in the OTP array 190 with blocks each of which is 512 KB in size. If the maximum signal 172 and minimum signal 174 indicate that the minimum block size is to be protected, the OTP logic 160 preferably associates each OTP cell in the OTP array 190 with blocks each of which is sixty-four KB in size. In another embodiment, other sizes might be obtained by associating each of the OTP cells with another portion of the memory 210. In addition, in an alternate embodiment, the sizes of each of blocks of the memory 210 may be different.

Figure 3:
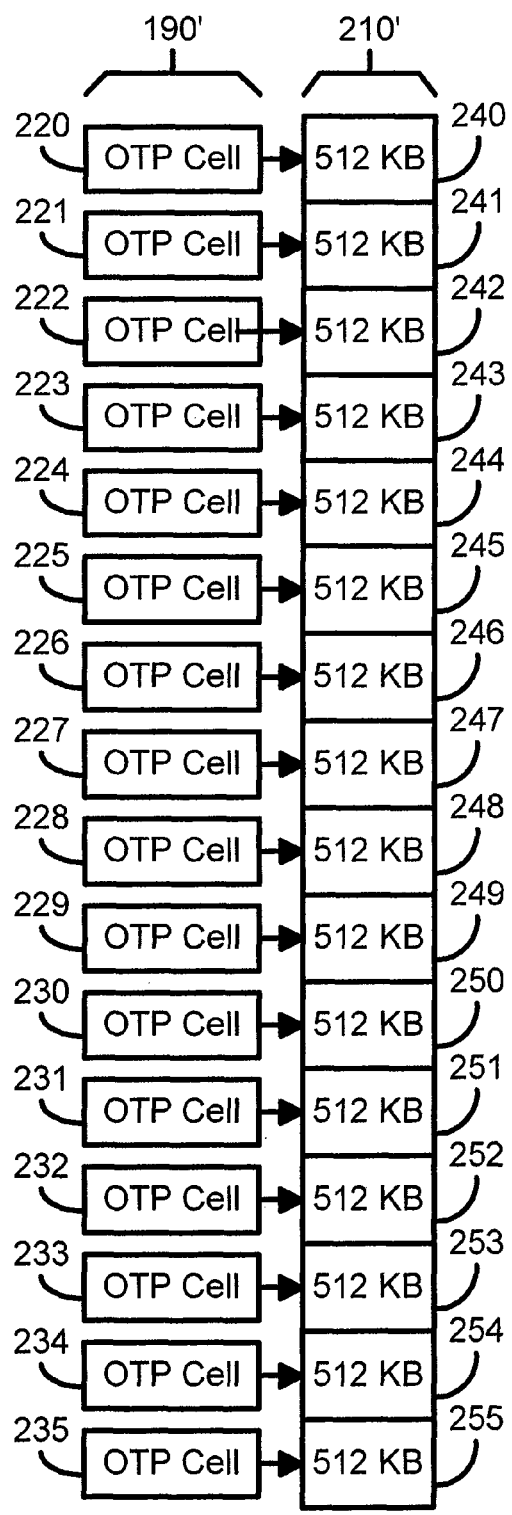
FIG. 3 is a more detailed diagram of one embodiment of a portion of a system in accordance with the present invention depicting the correspondence between OTP cells and a portion of the memory for a first size.
Figure 4:
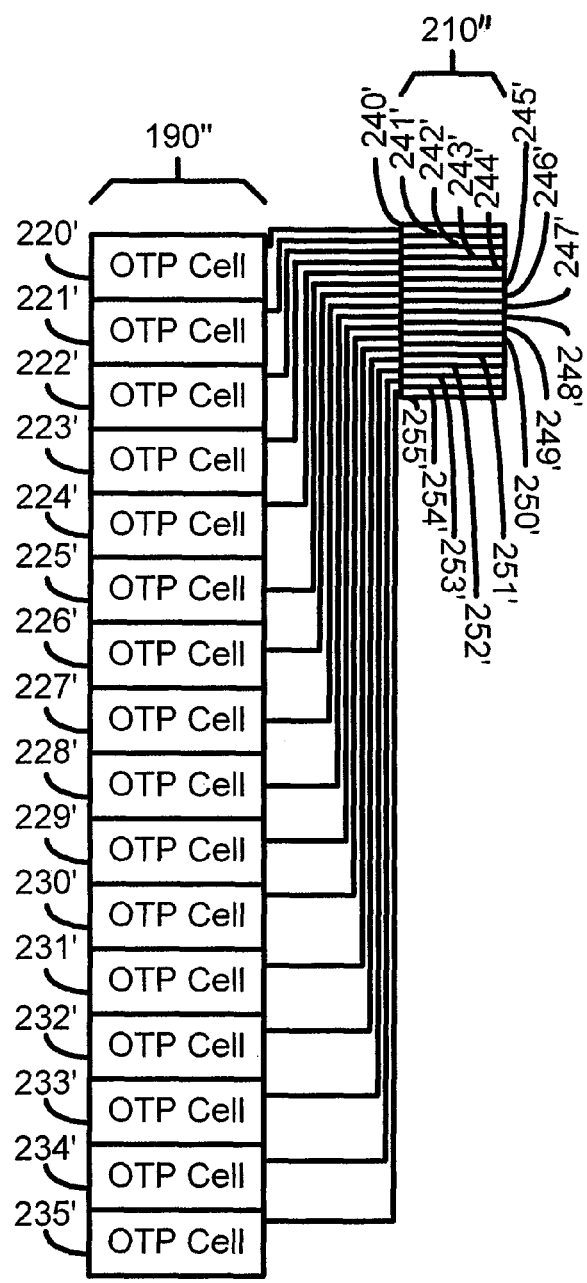
FIG. 4 is a more detailed diagram of one embodiment of a portion of a system in accordance with the present invention depicting the correspondence between OTP cells and a portion of the memory for a second size.

FIGS. 3-4 depict the example above. Thus, portions of FIGS. 3 and 4 are labeled similarly to their counterparts in FIG. 2. For example, the OTP array 190' and 190" of FIGS. 3 and 4, respectively, correspond to the OTP array 190 of FIG. 2. Similarly, the memory blocks 210' and 210" of FIGS. 3 and 4, respectively, correspond to the memory blocks 210 of FIG. 2. Referring to FIGS. 2-4, the OTP array 190' includes OTP cells 220-235. The memory 210' is depicted as including sixteen blocks 240-255. For the state depicted in FIG. 3, the OTP logic 160 has set the size of the blocks 240-255 that may be protected against modification to the maximum size. Thus, each OTP cell 220-235 corresponds to a single block 240'-255', respectively, of 512 KB in size. Stated differently, the OTP cell 220' corresponds to the first 512 KB of the memory, the OTP cell 221' corresponds to the second 512 KB of memory, and so on. Similarly, for the state depicted in FIG. 4, the OTP logic 160 has set the size of the blocks 240-255 that are protected to the minimum size. Thus, each OTP cell 220'-235' of the OTP array 190" corresponds to a single block 240'-255', respectively, of sixty-four KB in size. Consequently, the OTP cell 220 corresponds to the first sixty-four KB of the memory, the OTP cell 221 corresponds to the second sixty-four KB of memory, and so on. Thus, in a preferred embodiment, the size of block 240-255 or 240'-255' is configurable to be a maximum or minimum size, respectively, by associating each OTP cell 220-235 or 220'-235' respectively, with a different portion of each of the memory blocks 210.

The CUI 180 provides commands to the OTP logic 160 as well as to the enable/disable block 200. The CUI 180 preferably allows the entire OTP array 190 to be disabled using an enable/disable command 182. Consequently, the programming protect feature afforded by the system 150 is turned off. Using a programming enable/disable command 184, the CUI 180 may disable programming of the OTP cells in the OTP array 190 by locking the OTP array 190. Such a feature might be used after certain portions of the memory blocks 210 are selected as being protected to preclude further changes to the portion of the memory blocks 210 that are protected. In order to provide these features, the CUI 180 preferably provides the enable/disable command 182 and programming enable/disable command 184 to enable/disable block 200. In one embodiment, the CUI 180 provides the enable/disable and programming enable/disable commands 182 and 184 to OTP cells (not explicitly depicted in FIG. 2) in the enable/disable block 200.

Figure 5:
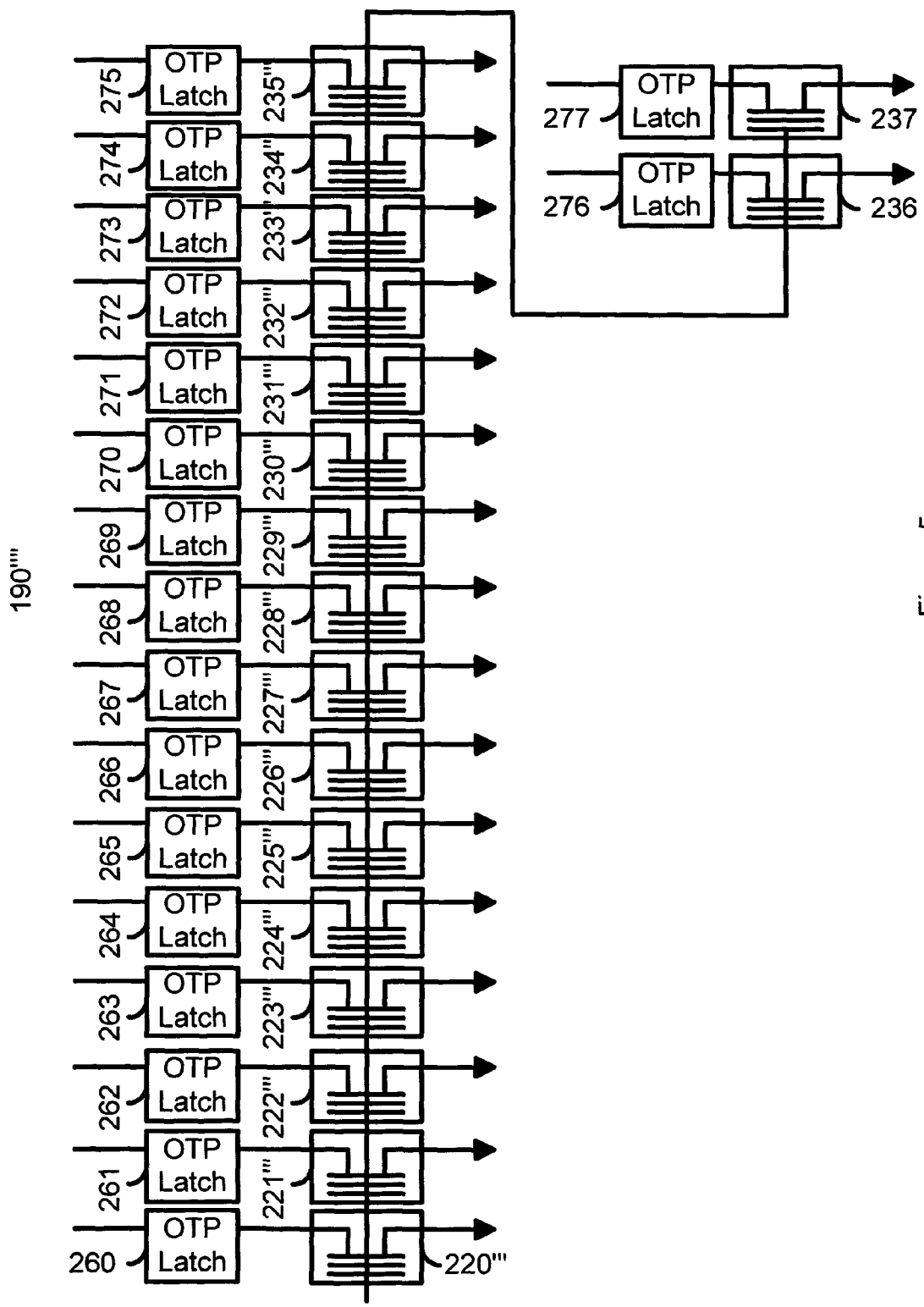
FIG. 5 is a more detailed diagram of one embodiment of an array of OTP cells in accordance with the present invention.

FIG. 5 is a more detailed diagram of a preferred embodiment of an array of OTP cells in the OTP array 190''' in accordance with the present invention. However, nothing prevents the use of another OTP array having other constituents. The OTP array 190''' preferably corresponds to the OTP array 190 depicted in FIG. 2. The OTP cells 220''-235'' preferably correspond to the OTP cells 220 - 235 and 220'-235' depicted in FIGS. 3-4. Referring to FIGS. 2 and 5, in the embodiment shown, the enable/disable block 200' is part of the OTP array 190'. The OTP array 190''' thus includes a total of eighteen OTP cells 220''-235'' and 236-237. Each of the OTP cells 220''-235'' preferably corresponds to a single block of the memory blocks 210. Each OTP cell 220''-235'' also has a corresponding OTP latch 260-277.

Figure 6:
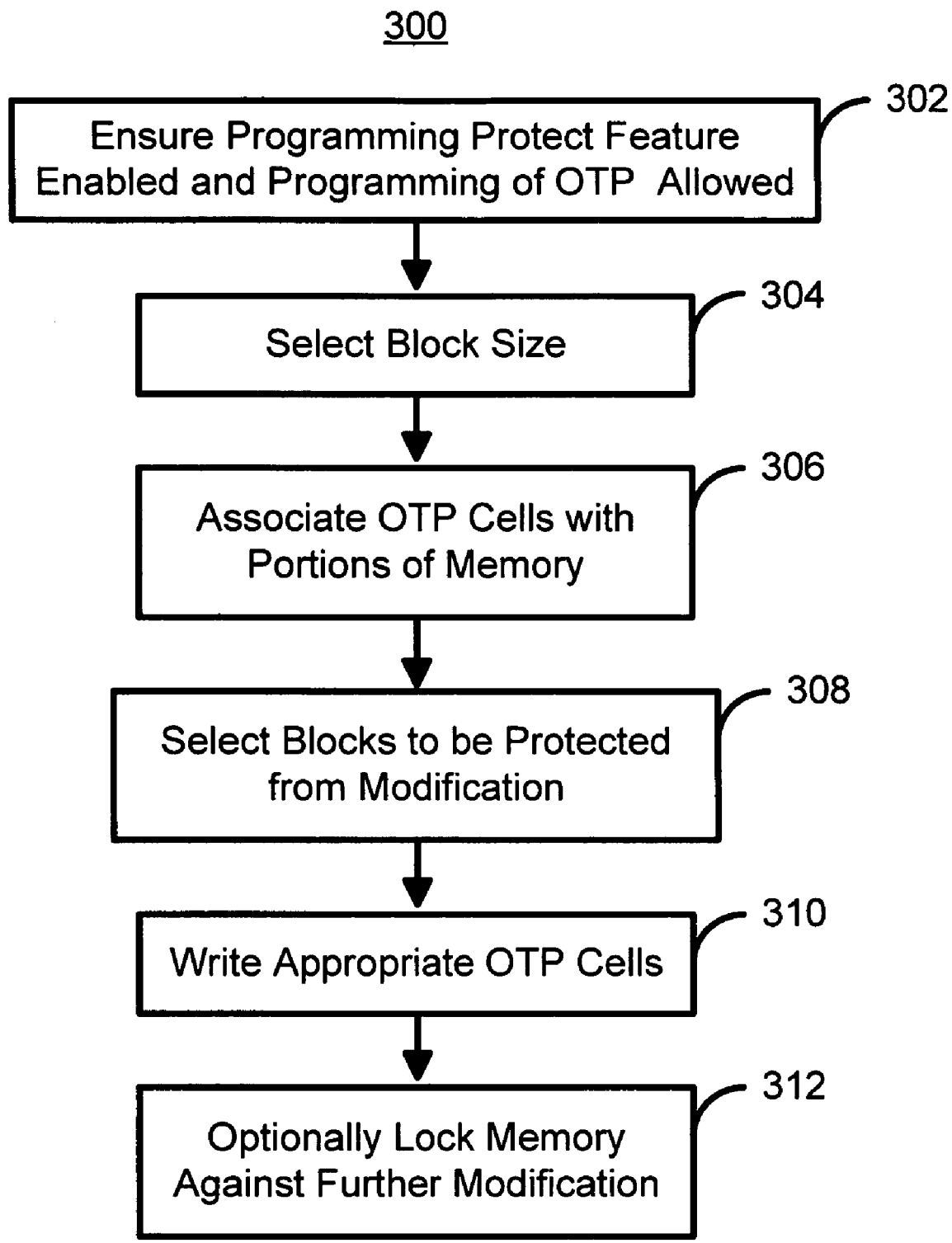
FIG. 6 is a flow chart depicting one embodiment of a method in accordance with the present invention for protecting a memory from being modified.

FIG. 6 is a flow chart depicting one embodiment of a method 300 in accordance with the present invention for protecting a memory from being programmed. For clarity, the method 300 is described in the context of the system 150. However, nothing prevents the method 300 from being used with another system.

Referring to FIGS. 2-6, the protection feature is enabled and programming of the OTP cells in the OTP array 190 is allowed, via step 302. In a preferred embodiment, step 302 is performed by setting the enable/disable and programming enable/disable signals 182 and 184, respectively, to be a logical one. The size(s) of the block of the memory 210 that may be protected from programming is determined, via step 304. In a preferred embodiment step 304 is performed by setting either the maximum signal 172 (for the maximum size) or the minimum signal 174 (for the minimum size) to a logical one. Thus, the OPT logic 160 is informed of the size of the blocks, such as the blocks 240-255 or 240'-255'. The OPT cells of the OTP array 190 are associated with the appropriate portions of the memory 210 such that the blocks have the desired size, via step 306. For example, the sizes of the blocks 240-255 or 240'-255' are set. The portions of the blocks 240-255 or 240'-255' that are desired to be protected are selected, via step 308. Step 308 may thus include the user selecting the desired portion of the blocks 240-255 or 240'255', as well as the CUI 180 providing the command to permanently protect the desired portion of the blocks 240-255 or 240'255' from subsequent modification. For example, if the maximum size is selected, and only the blocks 240-242 are desired to be written, then the CUI 180 provides a command indicating that the OTP cells 220-222 are to be written. The appropriate ones of the OTP cells 220-235 or 220'-235' are written, via step 310. In the example above, the OTP cells 220-222 would be written in step 310. The user may then optionally lock the memory 210 against further modification, via step 312. Step 312 preferably includes the CUI setting the programming enable/disable signal 184 to a logical zero. Thus, the memory 210 is protected against future modifications.

Once the method 300 is completed, each time a command to modify a portion of the memory 210 is received, the OTP logic 160 determines whether a protected portion of the memory 210 is desired to be modified. In order to do so, the OTP logic 160 uses the OTP <15:0> 162, the address of the sector to be modified 164, whether the programming protection features is enabled or disabled using the enable/disable signal 182, and the size of the blocks which have been locked. The OTP logic 160 returns a sector protection signal 166 to the CUI, which indicates whether the requested portion of the memory 210 can be modified. In the example above, where blocks 240-242 are protected, the OTP logic 160 determines whether the modification requested lies within the blocks 240-242. Based on the determination, the sector protection signal 166 indicates that the modification can be made (sector lies outside of blocks 240-242 or protection is disabled) or not (the sector lies within the blocks 240-242 and the protection is enabled). Thus, using the method 300, the size of the blocks that are protected against programming can be configured, selected blocks can be protected against programming, and the blocks can be locked against future modification in a nonvolatile fashion. Consequently, the method 300 and system 100 can provide configurable, nonvolatile write protection.

A method and system for protecting a memory from being programmed has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A system comprising:
   a plurality of one time programmable (OTP) cells respectively corresponding to a plurality of blocks of the memory, at least one OTP cell of the plurality of OTP cells corresponding to at least one block of the plurality of blocks, the at least one OTP cell allowing modification of the at least one block when the at least one OTP cell is in a first state and preventing modification of the at least one block when the OTP cell is in a second state; and
   OTP cell logic coupled with the plurality of OTP cells, the OTP cell logic to determine to which portion of the memory a particular OTP cell corresponds and for selecting a size of each of the at least one block corresponding to the at least one OTP cell, wherein modification of the block is preventable via the OTP cell.

2. The system of claim 1 further comprising:
   at least one command user interface (CUI), coupled with the OTP cell logic, for providing at least one command for protecting a number of the at least one block, the at least one command for placing a portion of the plurality of OTP cells in the second state such that the number of the at least one block being protected from modification.

3. The system of claim 1 further comprising:
   at least one size selection block, coupled with the OTP cell logic for providing a signal indicating the size of each of the at least one block.

4. The system of claim 1 further comprising:
   an enable block for enabling and/or disabling programming and/or use of the plurality of OTP cells.

5. The system of claim 4 wherein the enable block further includes: at least one OTP cell for enabling and/or disabling programming of the plurality of OTP cells.

6. A non-transitory computer-readable medium containing a program including instructions configured to cause a computer to implement a method when executed, the method comprising:
   controlling OTP cell logic coupled with a plurality of one time programmable (OTP) cells respectively corresponding to a plurality blocks of memory, at least one OTP cell of the plurality of OTP cells corresponding to at least one block of the plurality of blocks, the at least one OTP cell allowing modification of the at least one block when the at least one OTP cell is in a first state and preventing modification of the at least one block when the OTP cell is in a second state, the OTP cell logic for determining to which portion of the memory a particular OTP cell corresponds and for selecting a size of each of the at least one block corresponding to the at least one OTP cell, wherein modification of the block is preventable via the OTP cell.

7. The computer-readable medium of claim 6 wherein the controlling instruction further includes:
instructions for allowing the OTP cell logic to select the size of each of the at least one block.

8. The computer-readable medium of claim 6 wherein the program further includes instructions for:
indicating the size of each of the at least one block.

9. The system of claim 1, wherein the OTP cell is a nonvolatile memory cell, maintaining it's state even when power to the nonvolatile memory is turned off.

10. The system of claim 1, wherein the multiple blocks of memories being protected are not a uniform size.

11. The system of claim 1, wherein the OTP cell logic has a minimum and maximum size allowable for block size determination.

12. The system of claim 2, wherein the CUI allows an entire OTP array to be at enabled, disabled, or combinations thereof.

13. The system of claim 1, wherein the OTP cell array is associated with a corresponding latch.

14. The computer-readable medium of claim 6 wherein the OTP cell logic includes enabling logic, disabling logic, or combinations thereof.

15. The computer-readable medium of claim 6 wherein the program further includes instructions for:
indicating the minimum size and the maximum size of the at least one block.

16. The computer-readable medium of claim 6 wherein the program further includes instructions for sending enabling/disabling commands to the OTP cells to disallow and allow modification of the at least one block of the plurality of blocks.

17. The system of claim 1 further comprising:
an enable/disable block coupled with the OTP cell logic, wherein the enable/disable block is configured to disable the OTP cells and allow modification of the at least one block of the plurality of blocks.

18. The system of claim 17 further comprising a command user interface (CUT) coupled with the enable/disable block, wherein the CUI is configured to provide an enable/disable command to the enable/disable block to enable and disable the OTP cells.

* * * * *